(12) United States Patent
Hirose

(10) Patent No.: US 7,821,805 B2
(45) Date of Patent: Oct. 26, 2010

(54) SEMICONDUCTOR MEMORY DEVICE

(75) Inventor: Masanobu Hirose, Kyoto (JP)

(73) Assignee: Panasonic Corporation, Osaka (JP)

( * ) Notice: Subject to any disclaimer, the term of this patent is extended or adjusted under 35 U.S.C. 154(b) by 146 days.

(21) Appl. No.: 12/180,040

(22) Filed: Jul. 25, 2008

(65) Prior Publication Data

US 2009/0034314 A1 Feb. 5, 2009

(30) Foreign Application Priority Data

Jul. 30, 2007 (JP) ............................. 2007-197538

(51) Int. Cl.
*G11C 5/06* (2006.01)
*G11C 5/02* (2006.01)
(52) U.S. Cl. .......................................... 365/63; 365/51
(58) Field of Classification Search .................... 365/63, 365/51
See application file for complete search history.

(56) References Cited

U.S. PATENT DOCUMENTS

| | | | |
|---|---|---|---|
| 5,554,867 A * | 9/1996 | Ajika et al. .................. 257/314 |
| 5,602,772 A | 2/1997 | Nakano et al. |
| 5,629,887 A | 5/1997 | Nakano et al. |
| 6,115,288 A * | 9/2000 | Amanai et al. ......... 365/185.17 |
| 6,137,713 A | 10/2000 | Kuroda et al. |
| 2002/0181267 A1* | 12/2002 | Owa ........................... 365/63 |

FOREIGN PATENT DOCUMENTS

| | | |
|---|---|---|
| JP | 63-108764 | 5/1988 |
| JP | 06-349267 | 12/1994 |
| JP | 2000228508 A * | 8/2000 |

* cited by examiner

*Primary Examiner*—Ly D Pham
(74) *Attorney, Agent, or Firm*—McDermott Will & Emery LLP

(57) ABSTRACT

To secure a sufficient read-out voltage even when lines are arranged at a fine pitch, a semiconductor memory device including: a memory array in which a plurality of memory cells are arranged in rows and columns; and a plurality of bit lines associated with the respective columns of the memory cells is provided. The bit lines include main bit lines and sub bit lines to have a hierarchical structure, the main bit lines are divided among a plurality of interconnection layers, and a distance between the main bit lines in one of the interconnection layers is larger than a distance between the sub bit lines.

43 Claims, 14 Drawing Sheets

SEMICONDUCTOR MEMORY DEVICE

BACKGROUND OF THE INVENTION (1) Field of the Invention

The present invention relates to semiconductor memory devices such as dynamic random access memories (DRAMs), static RAMs (SRAMs), flash memories, MRAMs, PRAMs, and ReRAMs.

(2) Disclosure of the Prior Art

One of known conventional semiconductor memory devices is a DRAM with a so-called hierarchical bit-line architecture in which a plurality of pairs of sub bit lines are provided for a pair of main bit lines in order to, for example, reduce the number of sense amplifiers relative to the number of memory cells (see, for example, Japanese Laid-Open Patent Publication No. 6-349267).

In this type of DRAM, as schematically illustrated in FIG. 13, for example, four separate sub bit lines, e.g., sub bit lines /SBL20 through /SBL23, each having a length obtained by substantially equally diving the length of a main bit line, e.g., a main bit line /MBL2, are arranged in a main memory array region MM. Each main bit line is connected to a sense amplifier (not shown) so that a signal read out from a memory cell is sense-amplified.

The sub bit lines and the main bit lines are arranged at the same pitch as that of memory cells (not shown). More specifically, as illustrated in FIG. 14 showing a section Y in FIG. 13, sub bit lines SBL00 through SBL03 . . . /SBLn0 through /SBLn3 and main bit lines MBL0 through /MBLn are provided between word lines WL0 (through WL255) and word-line backing lines WL0_M (through WL255_M). The sub bit lines are evenly spaced and the main bit lines are also evenly spaced. Each of the sub bit lines and an associated one of the main bit lines overlap when viewed from above.

In such a DRAM, a read-out voltage $\Delta V$ obtained when data is read out from a memory cell is represented as:

$$\Delta V = \{1/(1+Cb/Cs)\} \times VDD/2 - Vnoise$$

where Cb is the sum of parasitic capacitances of a main bit line and a sub bit line (bit-line load capacity), Cs is the storage capacity of a memory cell, VDD is a power supply voltage, and Vnoise is a signal voltage which is lost by coupling noise, for example.

As also shown in FIG. 14, if a parasitic capacitance between the main bit line MBL1 and other lines is taken as an example, the bit-line load capacity Cb is the sum of a side coupling capacitance Cc, an overlap capacitance Co and a fringe capacitance Cf, for example.

However, conventional semiconductor memory devices have drawbacks such as difficulty in stable operation due to a decrease in a read-out voltage $\Delta V$ caused by reduction in line pitch. That is, when the line pitch decreases, especially the side coupling capacitance Cc increases and, thereby, coupling noise also increases. The increase in side coupling capacitance Cc and/or coupling noise causes the read-out voltage $\Delta V$ to decrease. This phenomenon is particularly conspicuous for lines with relatively large lengths such as main bit lines in a hierarchical bit-line architecture as described above or bit lines having no hierarchical bit-line architecture.

SUMMARY OF THE INVENTION

It is therefore an object of the present invention to ease suppression of decrease in a read-out voltage even with a fine line pitch, for example.

To achieve the object, a semiconductor memory device according to the present invention includes: a memory array in which a plurality of memory cells are arranged in rows and columns; and a plurality of bit lines associated with the respective columns of the memory cells. In the semiconductor device, the bit lines include main bit lines and sub bit lines to have a hierarchical structure, the main bit lines are divided among a plurality of interconnection layers, and a distance between the main bit lines in one of the interconnection layers is larger than a distance between the sub bit lines.

In this structure, the distance between adjacent bit lines is larger than that in the structure in which bit lines are included in a single interconnection layer. Accordingly, side coupling capacitance is easily reduced and the influence of coupling noise is also reduced.

DETAILED DESCRIPTION OF THE PREFERRED EMBODIMENTS

Figure 1:
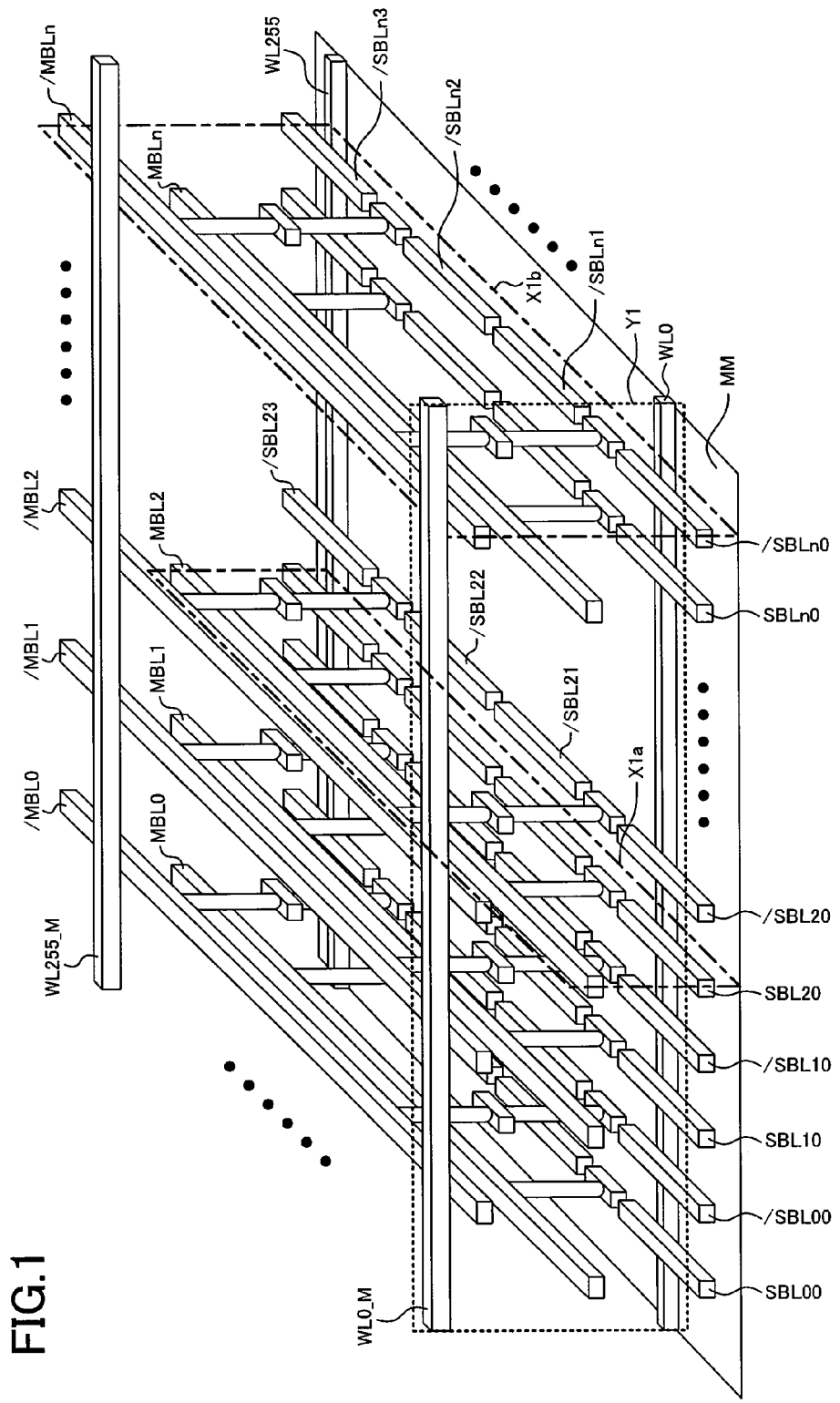
FIG. 1 is a perspective view schematically illustrating a stereoscopic structure of a main portion of a DRAM according to a first embodiment of the present invention.

Hereinafter, preferred embodiments of the present invention will be described with reference to the accompanying drawings. In the following embodiments, each member with substantially the same function is identified by the same reference numeral and description thereof is not repeated.

Embodiment 1

A DRAM according to a first embodiment of the present invention will be described. The DRAM of this embodiment has a hierarchical bit-line architecture, a folded bit-line architecture and a word-line backing configuration.

Figure 2:
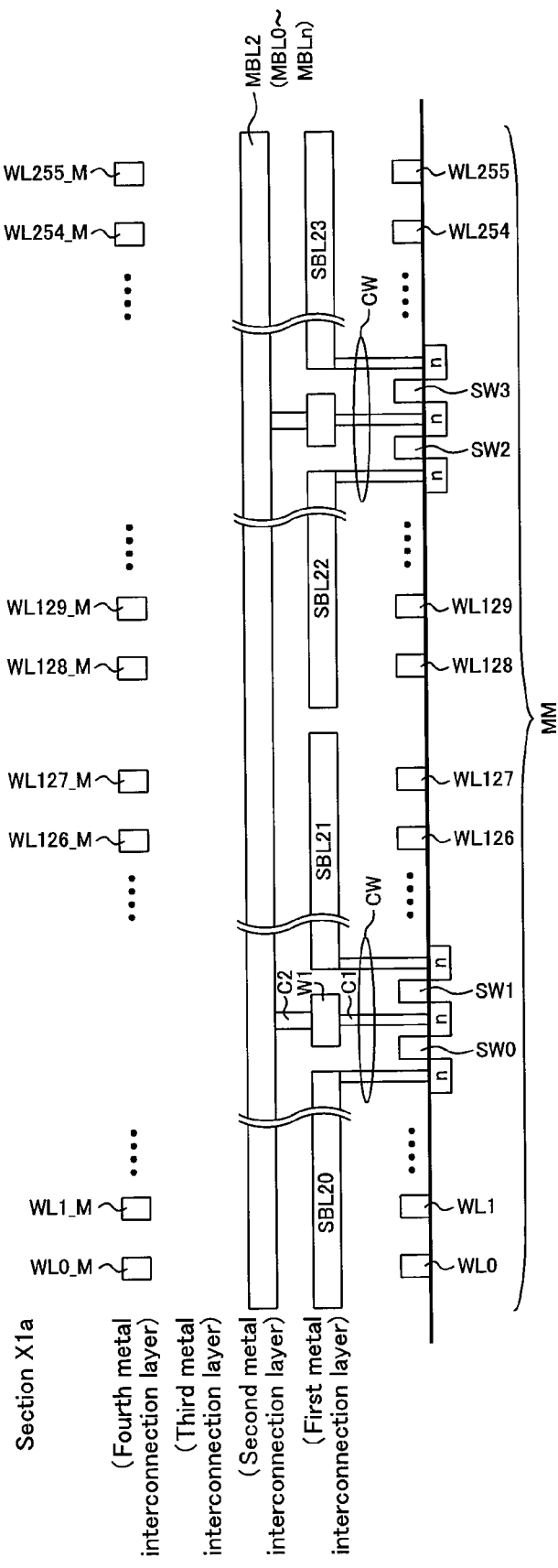
FIG. 2 is a view illustrating a section X1a in FIG. 1.
Figure 3:
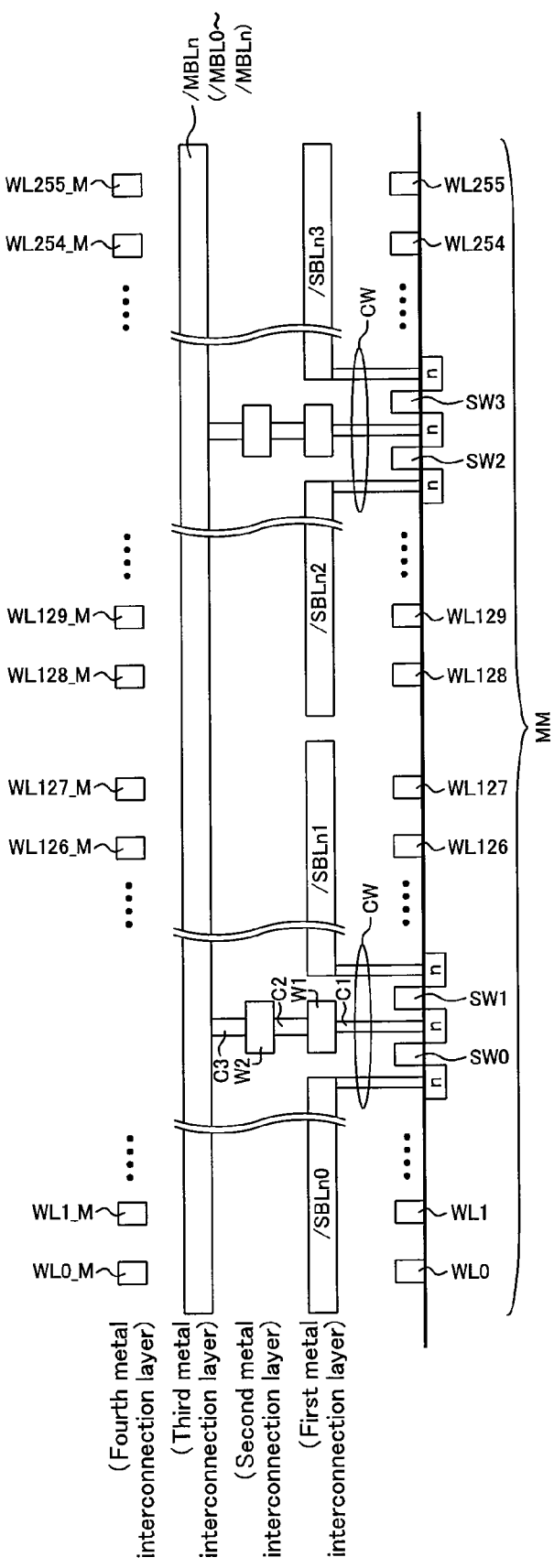
FIG. 3 is a view illustrating a section X1b in FIG. 1.
Figure 4:
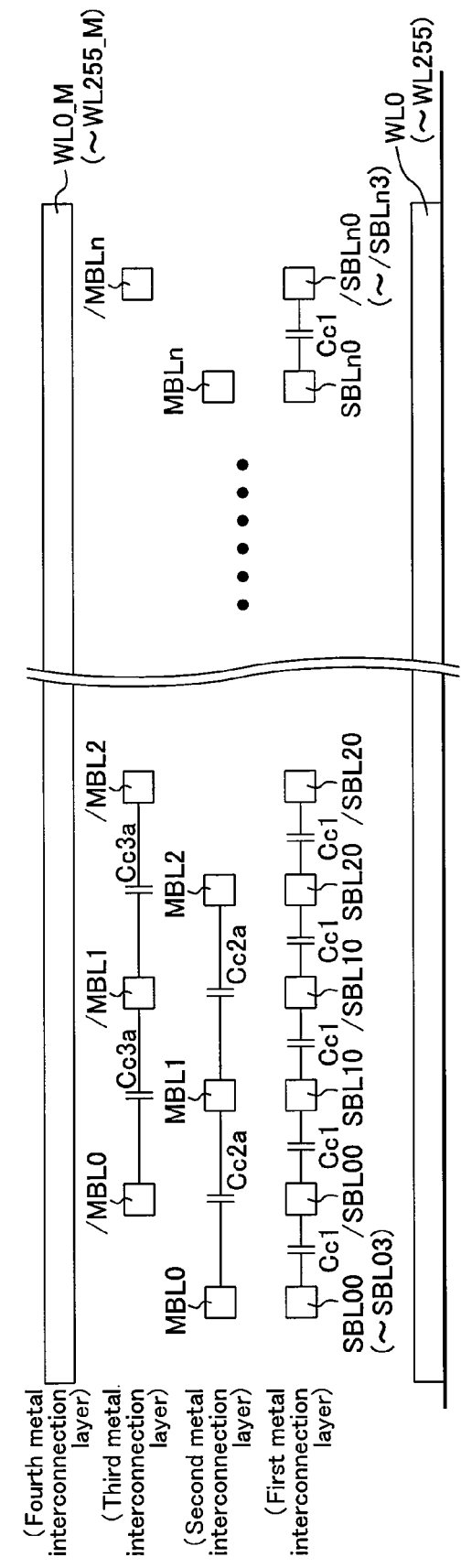
FIG. 4 is a view illustrating a section Y1 in FIG. 1.

FIG. 1 is a perspective view schematically illustrating a stereoscopic structure of a main portion of the DRAM. FIG. 2 is a view illustrating a section X1a in FIG. 1 (i.e., a vertical section at a main bit line MBL2). FIG. 3 is a view illustrating a section X1*b* in FIG. 1 (i.e., a vertical section at a main bit line /MBLn). FIG. 4 is a view illustrating a section Y1 in FIG. 1 (i.e., a vertical section at a word line WL0).

(General Structure of DRAM)

The DRAM has memory cells of, for example, (n+1) bits× 256 words in a main memory array MM. Bit lines for inputting/outputting stored data have a hierarchical bit-line architecture including main bit lines MBL0 through MBLn and /MBL0 through /MBLn and sub bit lines SBL00 through SBL03 . . . /SBLn0 through /SBLn3. The sub bit lines has a length obtained by dividing the length of the main bit lines into four. The bit lines also have a folded bit-line architecture as shown in FIG. 1.

As shown in FIGS. 2 and 3, each main bit line (e.g., MBL2 or /MBLn) is selectively connected to one of sub bit lines SBL20 through SBL23 or SBLn0 through /SBLn3 via switches (hierarchical switches) SW0 through SW3. Each main bit line is also connected to a sense amplifier (not shown). An output from the sense amplifier is transmitted through a global data line (not shown) and a main amplifier (not shown). The global data line and the main amplifier are provided for, for example, every given number of sense amplifiers.

Word lines WL0 through WL255 extend perpendicularly to the main and sub bit lines. The word lines WL0 through WL255 are made of, for example, polysilicon and are connected to word-line backing lines WL0_M through WL255_M in a plurality of shunt regions (not shown). The word-line backing lines back the word lines and are made of a metal such as aluminum or copper.

Though not shown, memory cells (not shown) are provided near respective intersections of the sub bit lines SBL00 . . . and the word lines WL0 . . . .

(Interconnection Layers Including Lines)

The sub bit lines SBL00 through SBLn3, for example, are made of a first metal (i.e., are provided in a first metal interconnection layer). On the other hand, some of the main bit lines are made of a second metal (i.e., are provided in a second metal interconnection layer) and the other main bit lines are made of a third metal (i.e., are provided in a third metal interconnection layer). In other words, the bit lines are divided among the second and third metal interconnection layers. Specifically, the main bit lines MBL0 through MBLn are made of the second metal, whereas the main bit lines /MBL0 through /MBLn are made of the third metal. That is, these main bit lines are staggered as shown in FIG. 4.

The word-line backing lines WL0_M through WL255_M are made of a four metal (i.e., are provided in a four metal interconnection layer) at a higher level.

The main bit lines MBL0 through MBLn are connected to the switches SW0 through SW3 (shown in FIG. 2) via contacts C1 and C2 and an intermediate line W1 of the first metal. The main bit lines /MBL0 through /MBLn are connected to the switches SW0 thorough SW3 (shown in FIG. 3) via the contacts C1 through C3 and intermediate lines W1 and W2 of the first and second metals.

(Line-to-Line Capacitance)

Since the main bit lines are divided among the second and third metal interconnection layers as described above, the distance between adjacent ones of the main bit lines is twice as large as the distance between adjacent ones of the sub bit lines (i.e., the distance between the memory cells or the distance between main bit lines in the case of being provided in a single interconnection layer), as shown in FIG. 4. In this manner, substantially the same number of main bit lines are provided in each of a plurality of interconnection layers at substantially the same pitch so that a side coupling capacitance $Cc2a$ between, for example, the main bit lines MBL0 through MBLn and a side coupling capacitance $Cc3a$ between, for example, the main bit lines /MBL0 through /MBLn are easily reduced even in a structure in which memory cells are arranged at a fine pitch.

In addition, as shown in FIG. 4, when the main bit lines MBL0 through MBLn and /MBL0 through /MBLn are staggered (e.g., the main bit lines MBL0 through MBLn laterally shift ½ pitch from the main bit lines /MBL0 through /MBLn in FIG. 4), an overlap capacitance between, for example, the main bit lines MBL0 and /MBL0 is also reduced. Alternatively, the main bit lines MBL0 and /MBL0 may overlap so that coupling noise from adjacent main bit lines, e.g., the main bit lines MBL1 and /MBL1, is further reduced even when the overlap capacitance increases.

Accordingly, not only the load capacity of the main bit lines but also coupling noise is easily reduced. Thus, a sufficiently high read-out voltage is secured to obtain stable operation without penalties in chip area and power consumption. Moreover, reduction of the line-to-line distance and increase in memory capacitance by increasing the number of cells arranged along the lengths of the main bit lines, for example, are also easily achieved.

In a configuration in which a large number (e.g., six or seven) of interconnection layers are laminated to form other circuit portions, such as a DRAM incorporated in, for example, system LSI, a read-out voltage is allowed to be secured especially without the need of additionally providing two interconnection layers for main bit lines as described above.

Embodiment 2

Figure 5:
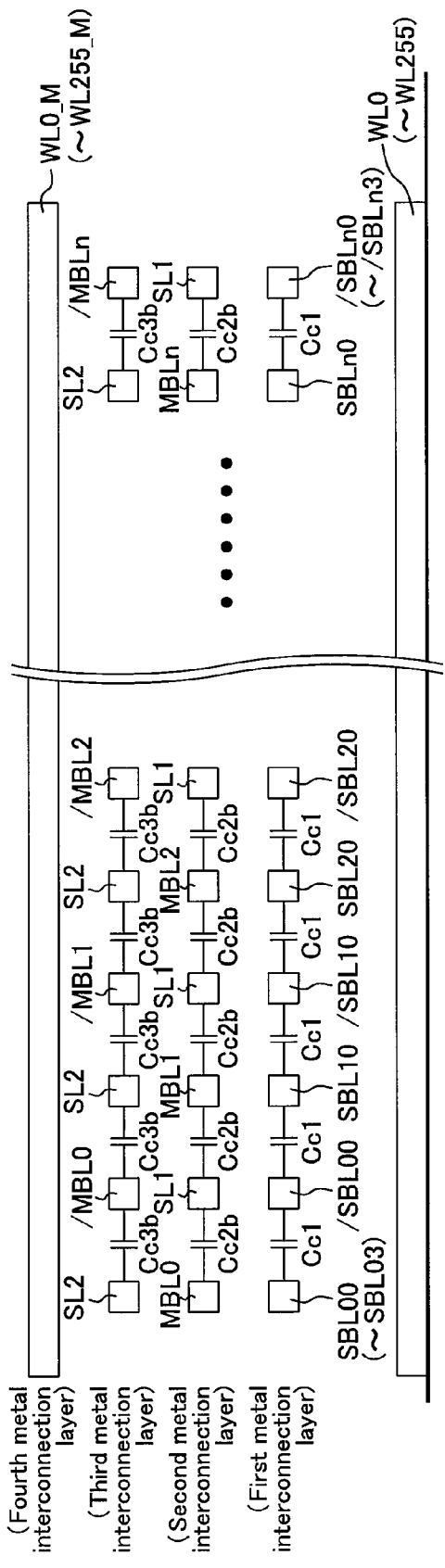
FIG. 5 is a cross-sectional view illustrating a structure of a DRAM according to a second embodiment of the present invention.

As illustrated in FIG. 5, another type of lines (given-potential lines) SL1 and SL2 may be provided between the main bit lines MBL0 and MBL1 or between the main bit lines /MBL0 and /MBL1, for example, in the DRAM of the first embodiment. The lines SL1 and SL2 are connected to power supplies of sense amplifiers to which main bit lines MBL0 . . . are connected or to fixed potential supplies such as ground, for example. The potential supply is not limited to a potential supply whose potential is always fixed as described above and only needs to be a potential supply whose potential is at a given level and whose impedance is sufficiently low when necessary (at least when the potential of the main bit lines changes in order to read stored data). The lines SL1 and SL2 may be connected to each other to have the same potential. The line SL1 may not be provided at a portion where intermediate lines W2 of a second metal (i.e., lines for connecting main bit lines /MBL0 through /MBLn to switches SW0 through SW3) as described in the first embodiment with reference to FIG. 3. Even in such a case, such portions are so small with respect to the whole length of the main bit lines (e.g., about ¼64, ¼32 or ¼16) that the same advantages are obtained.

In the above configuration, coupling capacitances $Cc2b$ and $Cc3b$ between the main bit lines MBL0 . . . and the lines SL1 and SL2 are about twice as large as coupling capacitances $Cc2a$ and $Cc3a$ in FIG. 4. However, the lines SL1 and SL2 serve as shielding lines as long as the lines SL1 and SL2 have a fixed potential, for example. Accordingly, the influence of noise is reduced so that stable operation is easily obtained by securing a sufficiently high read-out voltage.

When the lines SL1 and SL2 are connected to lines at a potential serving as a fixed potential in a DRAM, such as the power supplies of sense amplifiers or ground, the power supply lines, for example, are arranged in a mesh form (i.e., a mesh interconnection structure) so that the resistance of lines is easily reduced, thus obtaining more stable operation.

The lines SL1 and SL2 may be replaced with global data lines which will be described in a fourth embodiment of the present invention. In such a case, the influence of noise is also reduced.

Embodiment 3

In a third embodiment of the present invention, in stead of providing adjacent main bit lines in different interconnection layers as described in the first embodiment, each two complementary main bit lines in a folded bit-line architecture are provided as a pair and the main bit lines are divided among a plurality of interconnection layers in units of pairs.

Figure 6:
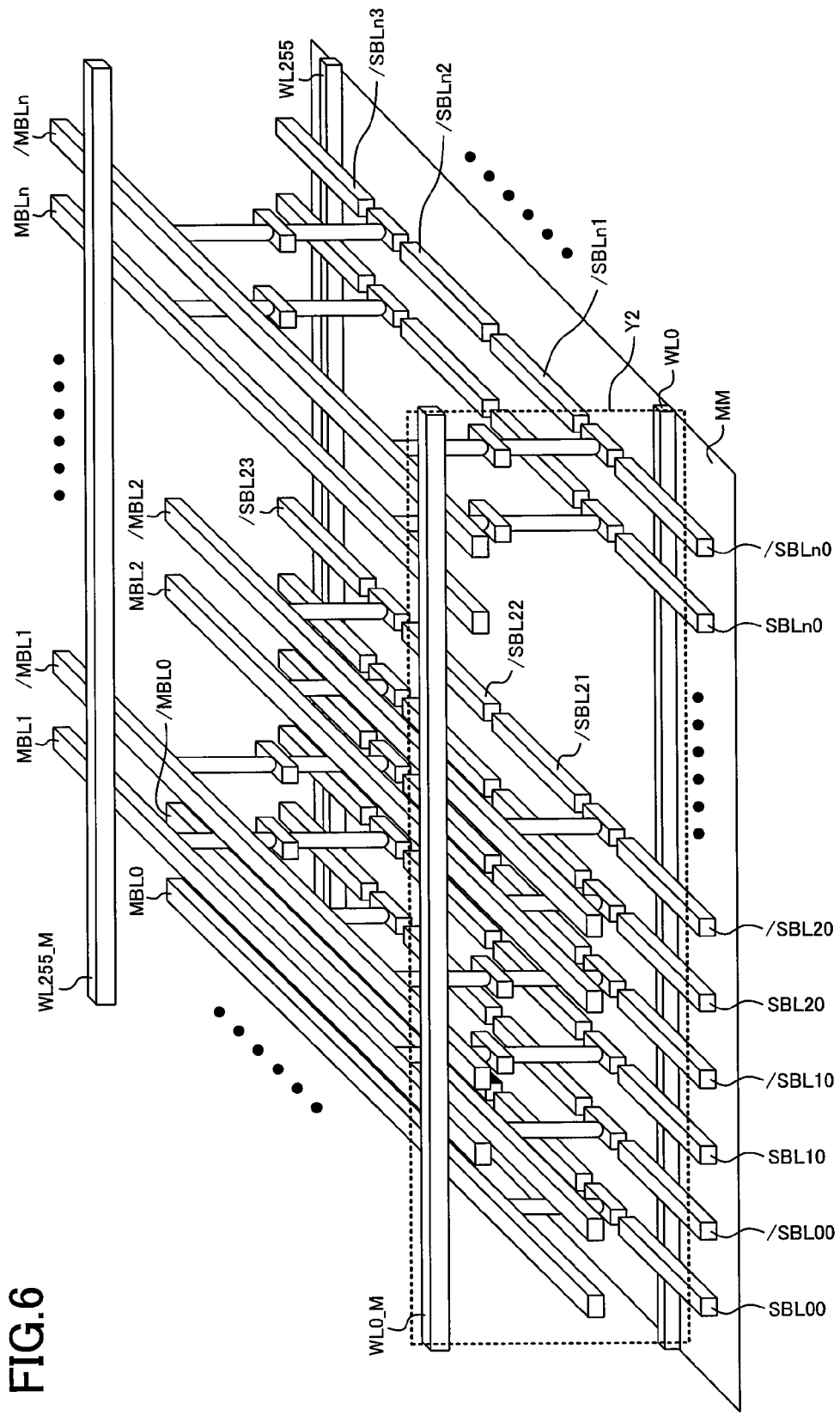
FIG. 6 is a perspective view schematically illustrating a stereoscopic structure of a main portion of a DRAM according to a third embodiment of the present invention.
Figure 7:
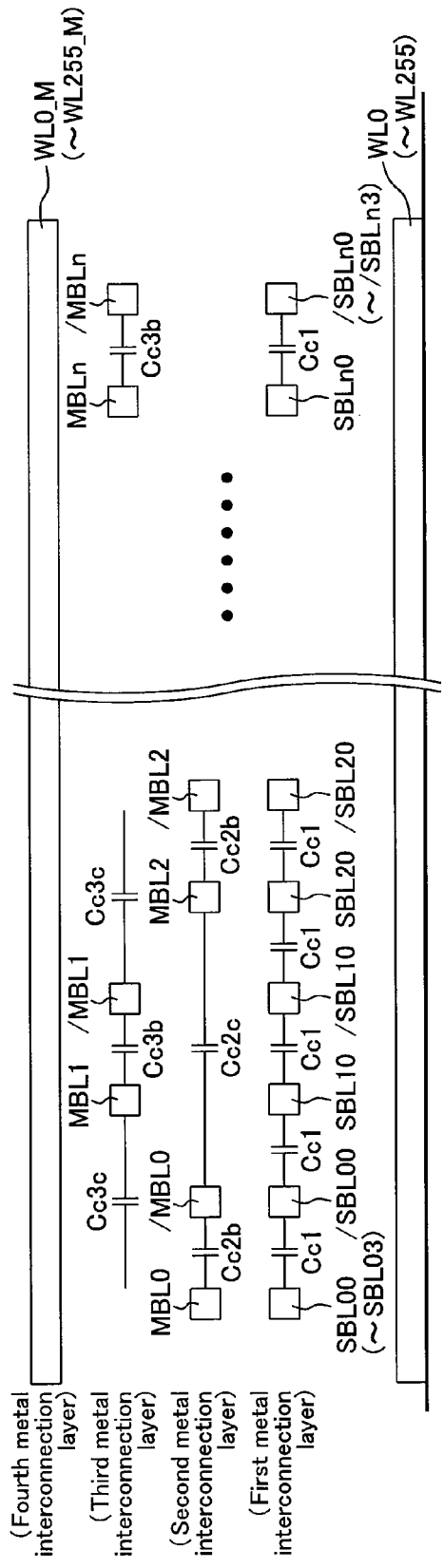
FIG. 7 is a view illustrating a section Y2 in FIG. 1.

Specifically, in a DRAM according to the third embodiment, pairs of main bit lines (MBL0 and /MBL0), (MBL2 and /MBL2), . . . are provided in a second metal interconnection layer, whereas pairs of main bit lines (MBL1 and /MBL1), (MBL3 and /MBL3), . . . are provided in a third metal interconnection layer, as illustrated in FIGS. 6 and 7, for example. That is, the distance between, for example, a pair of main bit lines (MBL0 and /MBL0) is the same as that between sub bit lines, whereas the distance between, for example, main bit lines /MBL0 and MBL2 respectively belonging to adjacent pairs of main bit lines is three times as large as the distance between the sub bit lines. (Suppose a side coupling capacitance between each pair of main bit lines as shown in FIG. 7 is Cc2$b$ or Cc3$b$ and a side coupling capacitance between main bit lines respectively belonging to different pairs is Cc2$c$ or Cc3$c$, the following relationships are established: Cc2$b$>Cc2$c$ and Cc3$b$>Cc3$c$)

In this configuration, though the side coupling capacitances Cc2$b$ and Cc3$b$ between, for example, the pair of main bit lines (MBL0 and /MBL0) are larger than those in the first embodiment, the influence of coupling noise between these complementary main bit lines is less likely to occur. The influence of coupling noise between, for example, the main bit lines /MBL0 and MBL2 of adjacent pairs is also less likely to occur because of reduction of, for example, the side coupling capacitances Cc2$c$ and Cc3$c$ between these lines. Accordingly, especially the influence of coupling noise is reduced so that a sufficiently high read-out voltage is easily obtained. In addition, the line-to-line capacitance and the resistance of complementary main bit lines are made uniform so that a read-out voltage ΔV and a read-out speed are uniform even when data is read out from any one of the pair of the main bit lines (MBL0 and /MBL0), for example, thus easily obtaining more stable operation.

This embodiment is the same as the first embodiment in that overlap capacitance is also easily reduced by staggering the bit lines in units of pairs.

As illustrated in FIGS. 6 and 7, since the distance between the main bit lines /MBL0 and MBL2, for example, is larger than that between the sub bit lines, the width of the main bit lines may be increased to reduce the resistance for high read-out speed.

Embodiment 4

In a structure in which main bit lines are arranged in units of pairs as in the third embodiment, another type of lines (given-potential lines) may be provided between main bit lines /MBL0 and MBL2, for example, in the same manner as in the second embodiment. Especially when the distance between the main bit lines is greater than twice the distance between sub bit lines, the width of these lines is easily increased. Hereinafter, this will be more specifically described.

Figure 8:
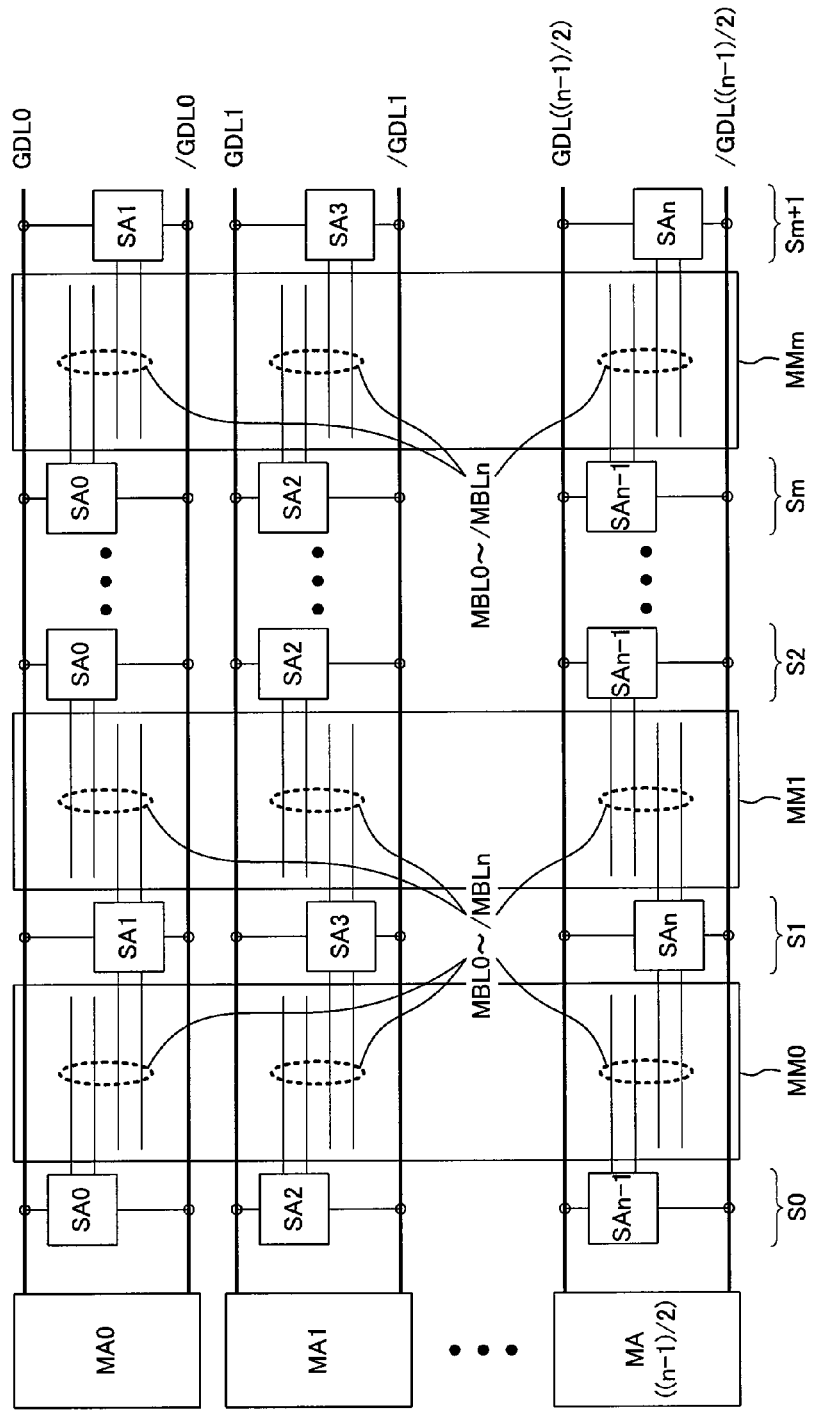
FIG. 8 is a circuit diagram showing a global data line GDL0 and other lines in a DRAM according to a fourth embodiment of the present invention.

As illustrated in FIG. 8, in a DRAM according to a fourth embodiment of the present invention, (m+1) main memory arrays MM0 through MMm are provided. Main bit lines MBL0 through /MBLn in each of the main memory arrays are connected to sense amplifiers SA0 through SAn constituting sense amplifier series S0 through Sm+1. The example shown in FIG. 8 employs a shared sense amplifier structure in which each of the sense amplifiers SA1 through SAn except for the sense amplifiers at both ends is shared by the main memory arrays at both sides thereof and the potential difference between a pair of main bit lines of one of the main memory arrays is selectively amplified. That is, the pitch of sense amplifiers SA0, for example, is twice as large as the pitch of the main memory arrays MM0 . . . .

A pair of global data lines GDL0 and /GDL0 and a main amplifier MA0 are provided for the pairs of sense amplifiers SA0 and SA1 in the sense amplifier series S0 through Sm+1, for example, so that the potential difference selectively output from one of the sense amplifiers SA0 and SA1 is amplified. The same holds for the other sense amplifiers SA2 through SAn.

Figure 9:
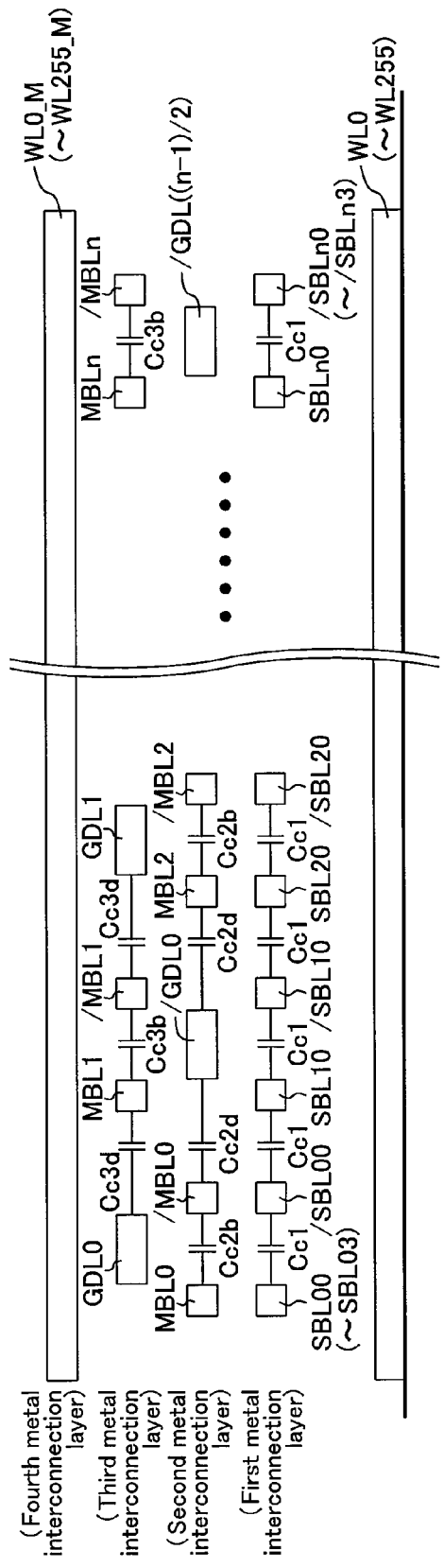
FIG. 9 is a cross-sectional view illustrating a structure of the DRAM of the fourth embodiment.

As illustrated in FIG. 9, each of the global data lines GDL0 through /GDL((n−1)/2) is provided between the main bit lines /MBL0 and MBL2, for example, and has a width larger than that of the main bit lines. This arrangement is implementale because the number of global data lines GDL0 through /GDL((n−1)/2) is equal to or smaller than half of the number of main bit lines MBL0 through /MBLn.

In this configuration, the resistance between each of the global data lines GDL0 . . . and a pre-charge power supply is low when data is read out from the memory cells to the main bit lines via the sub bit lines, thus obtaining the shielding effect. This allows coupling noise from a pair of adjacent main bit lines to be easily reduced so that a sufficiently high read-out voltage is secured to obtain stable operation.

In the case where the global data lines GDL0 . . . are formed in an interconnection layer including the main bit lines, a sufficiently large width of the global data lines GDL0 . . . or distance between the global data lines GDL0 . . . and other lines are relatively easily secured as long as each of the global data lines GDL0 . . . is provided in a region which is three times as large as the pitch of the sub bit lines. In general, since the global data lines traverse all the main memory arrays to have a large line length, parasitic resistance and parasitic capacitance tend to increase. However, securing sufficiently large width and distance of/between the global data lines as described above easily avoids or suppresses great increases in access time and power consumption due to increases in charge/discharge time and amount of charge/discharge current of global data lines.

On the other hand, no interconnection layer for the global data lines GDL0 . . . is specifically needed. Thus, the number of interconnection layers is easily made equal to that in the case of forming all the main bit lines in one interconnection layer.

The ratio of the number of global data lines to the number of main bit lines is not necessarily 1:2 and may be lower than 1:2.

Not only the global data lines but also lines having a given potential as described in the second embodiment may be provided between a pair of main bit lines. Such lines may be provided in the same number and at the same pitch as the main bit lines.

Embodiment 5

Figure 10:
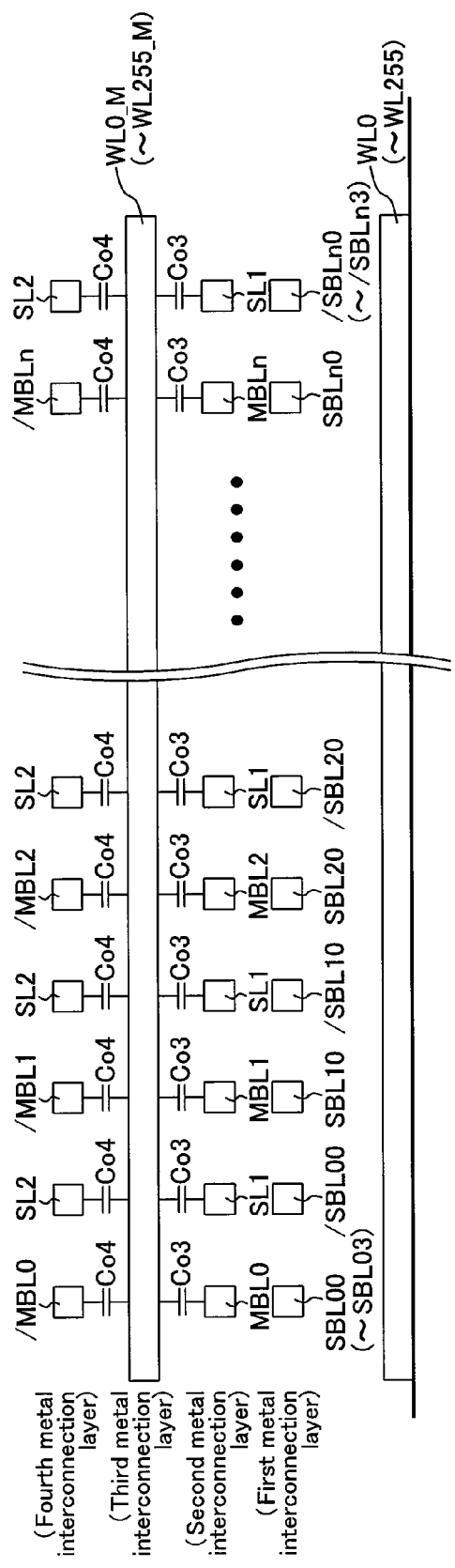
FIG. 10 is a cross-sectional view illustrating a structure of a DRAM according to a fifth embodiment of the present invention.

The order of lamination of interconnection layers is not limited to that described in the foregoing embodiments. For example, in a DRAM according to a fifth embodiment of the present invention, as illustrated in FIG. 10, word-line backing lines WL0_M through WL255_M which back word lines are provided between an interconnection layer including main bit lines MBL0 through MBLn and a line SL1 as described in the second embodiment and an interconnection layer including main bit lines /MBL0 through /MBLn and a line SL2 as described in the second embodiment. In this example illustrated in FIG. 10, the main bit lines MBL0 and /MBL0, for example, overlap each other with the word-line backing line WL0_M, for example, interposed therebetween. The same holds for the lines SL1 and SL2.

With this configuration, suppose the overlap capacitances between the main bit line MBL0 and the word-line backing line WL0_M, for example, and between the main bit line /MBL0 and the word-line backing line WL0_M, for example, are Co3 and Co4, respectively, these overlap capacitances Co3 and Co4 are easily made equal. Accordingly, coupling noise occurring from the word-line backing line WL0_M, for example, during driving of word lines has the same phase and is at the same level as coupling noise from the pair of complementary main bit lines MBL0 and /MBL0, for example, thereby canceling noise components. Thus, stable operation is easily obtained by securing a sufficient read-out voltage.

The order of lamination of interconnection layers described above is not limited to arrangement of lines in each interconnection layer as shown in FIG. 10, and is applicable to the arrangements in the first through fourth embodiments.

Embodiment 6

A DRAM circuit according to a sixth embodiment of the present invention will be described with reference to FIG. 11.

In this DRAM, a main memory array MM includes four sub memory arrays SM0 through SM3 so that data of 4×n bits×64 words is stored. Bit lines for inputting/outputting stored data have a hierarchical bit-line architecture including main bit lines MBL0 through MBLn (and /MBL0 through /MBLn) and sub bit lines SBL00 through SBLn0, . . . SBL03 through SBLn3 (and /SBL00 through /SBLn0, . . . /SBL03 through /SBLn3). The main bit lines are shared by the four sub memory arrays SM0 through SM3. The sub bit lines are respectively associated with the sub memory arrays SM0 through SM3. The bit lines also have a folded bit-line architecture.

Hereinafter, a portion of the sub memory array SM0 in which data of the first and second bits is stored will be mainly described as an example. Memory cells MC in each of which data of one bit is stored are provided at the intersections of two of every four of word lines WL0 through WL63 and sub bit lines SBL00 and /SBL00, respectively. More specifically, the memory cells MC are provided at the intersections of the word lines WL0, WL3, WL4, WL7, WL8, . . . , WL59, WL60 and WL63 and the sub bit lines SBL00 and the intersections of the word lines WL1, WL2, WL5, WL6, . . . , WL61 and WL62 and the sub bit line /SBL00.

The sub bit lines SBL00 and /SBL00 are connected to the main bit lines MBL0 and /MBL0 via bit-line connecting gates SW00 and /SW00 (bit-line connecting gates SW0 and /SW0) controlled by bit-line selecting lines KS0A and KS0B, respectively. Specifically, the sub memory arrays SM0 through SM3 are selected by selectively connecting the sub bit lines SBL00, /SBL00, . . . to the main bit lines MBL0 and /MB0.

The main bit lines MBL0 and /MB0 are connected to a sense amplifier SA0 so that a potential difference occurring between the main bit lines MBL0 and /MB0 according to data stored in the memory cell MC is amplified.

Figure 11:
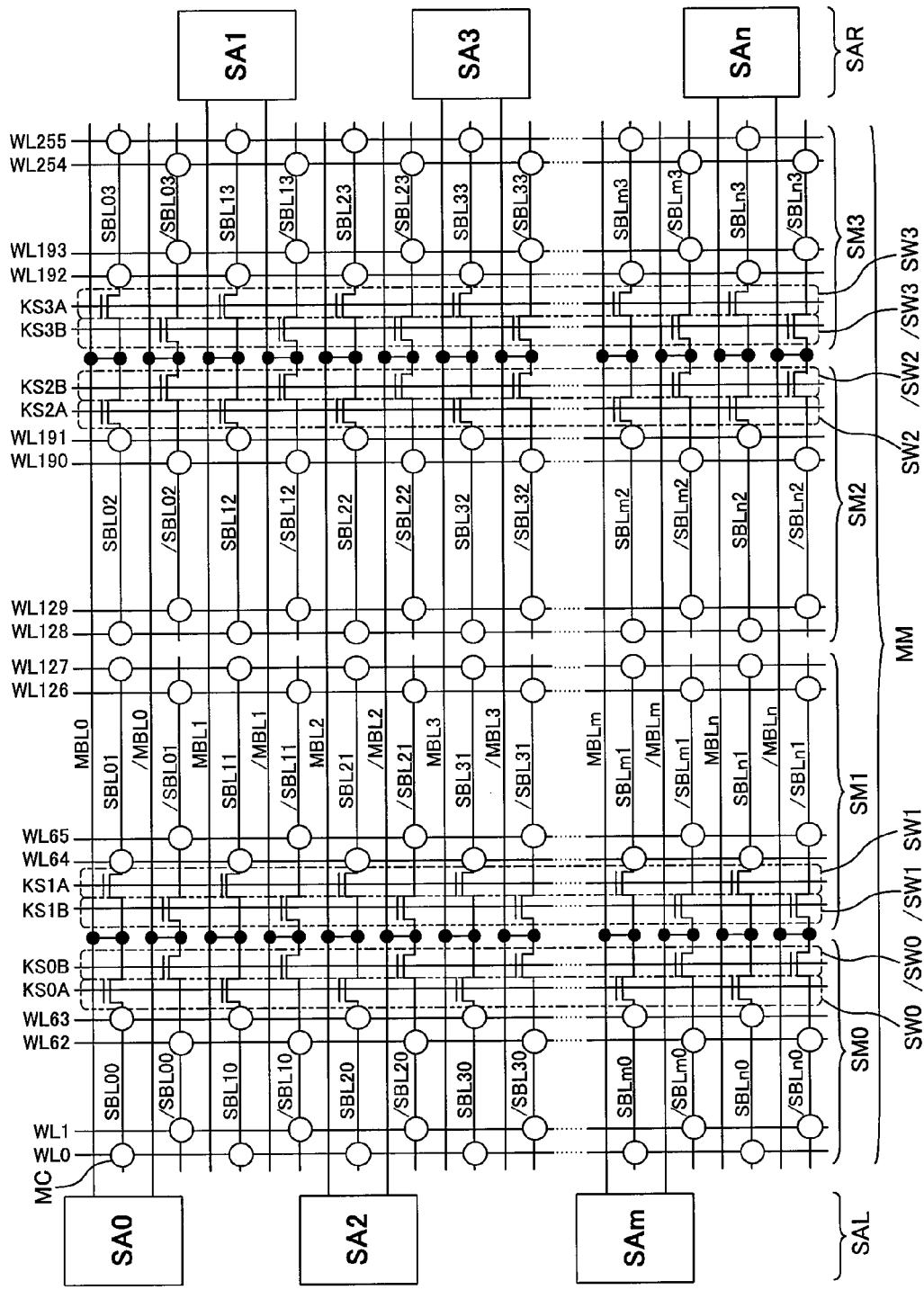
FIG. 11 is a circuit diagram of a DRAM according to a sixth embodiment of the present invention.

FIG. 11 illustrates the connection relationship among the components of the DRAM. FIG. 11 also generally relates to the arrangement of the components. Specifically, the bit-line connecting gates SW0, /SW0, SW1 and /SW1 are arranged in line symmetry near the midpoint between the sub memory arrays SM0 and SM1, and the bit-line connecting gates SW2, /SW2, SW3 and /SW3 are arranged in line symmetry near the midpoint between the sub memory arrays SM2 and SM3. The order of arrangement of the bit-line connecting gates SW0 . . . may differ as long as the line symmetry is maintained.

Figure 12:
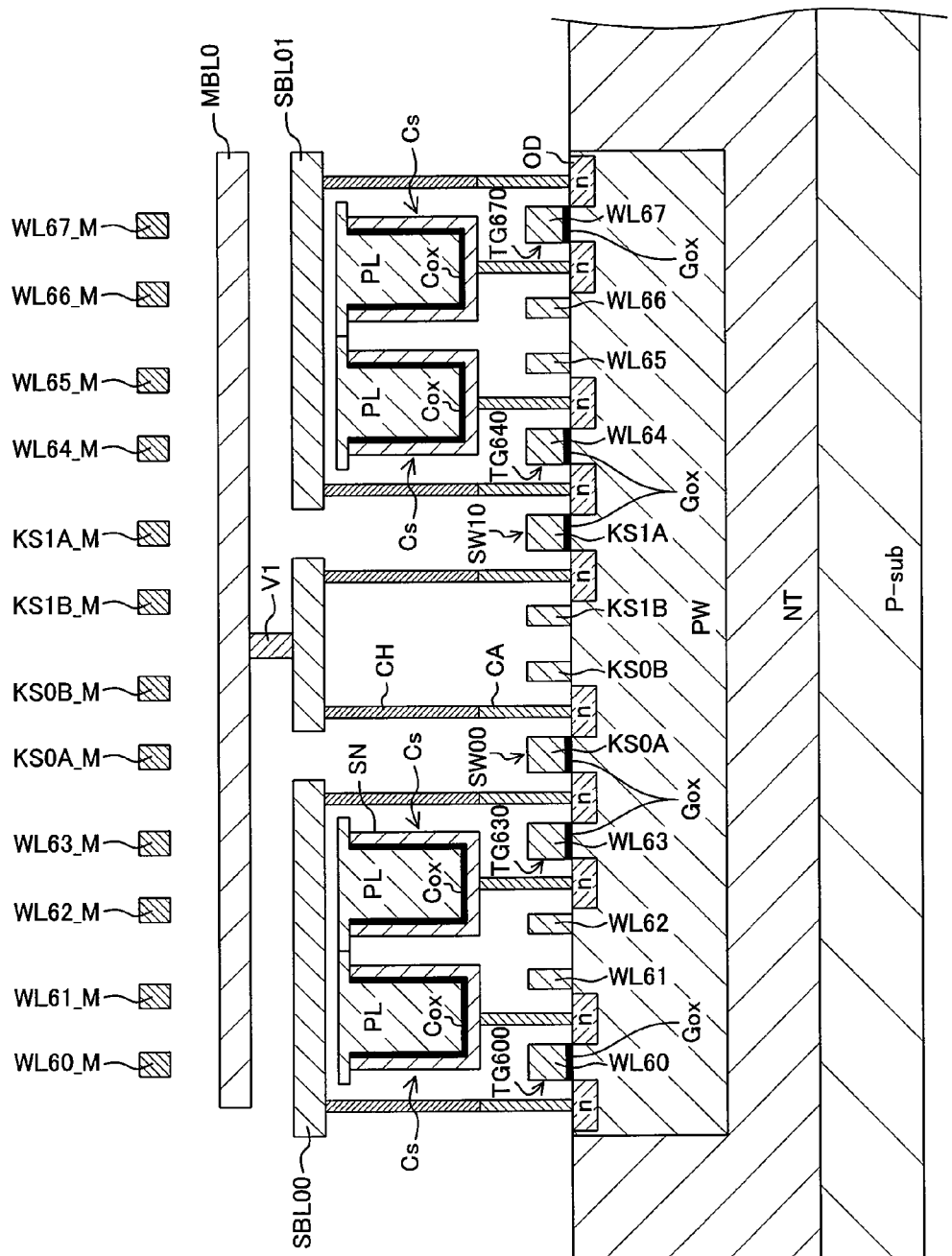
FIG. 12 is a cross-sectional view illustrating a structure of the DRAM of the sixth embodiment.
Figure 13:
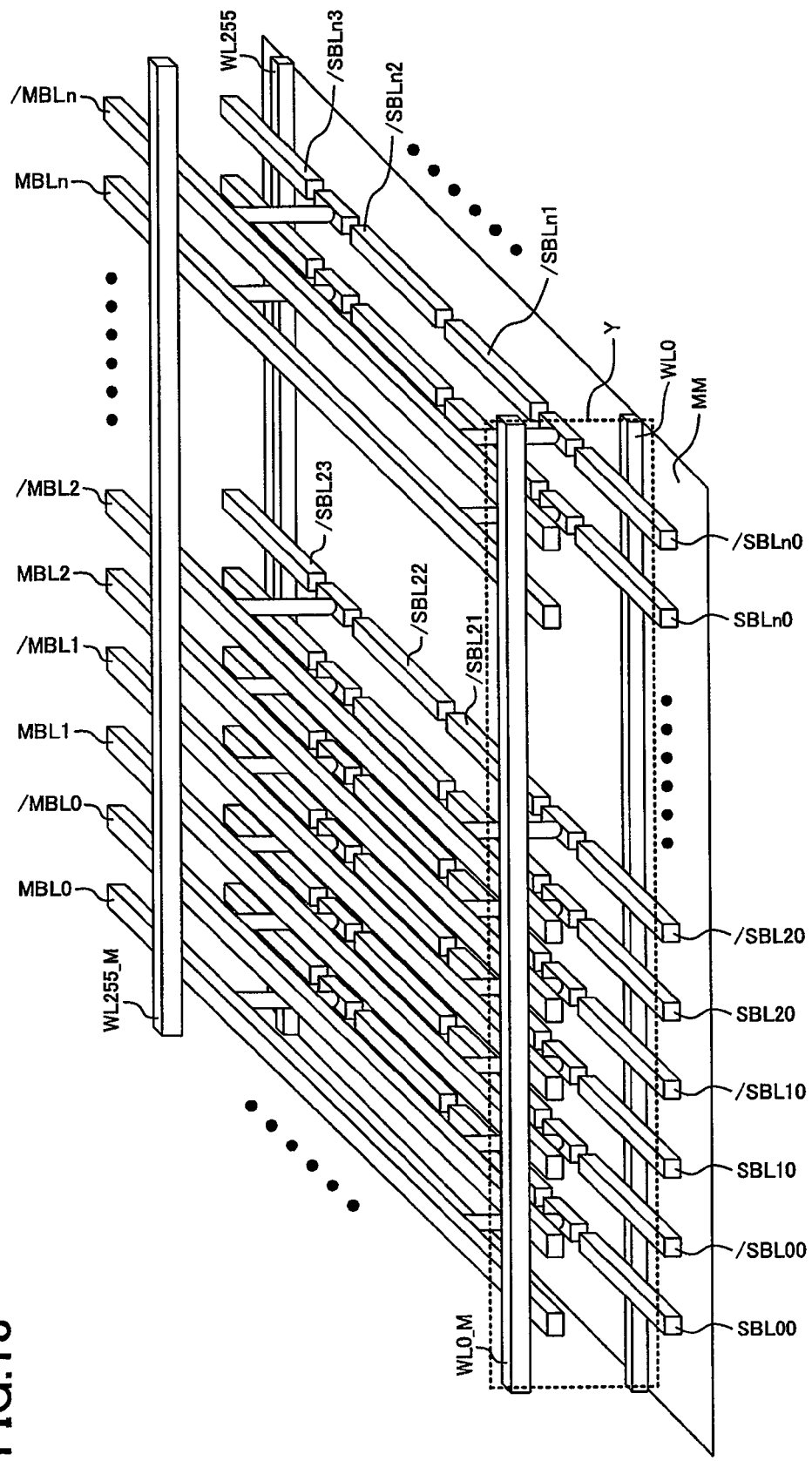
FIG. 13 is a perspective view schematically illustrating a stereoscopic structure of a main portion of a conventional DRAM.
Figure 14:
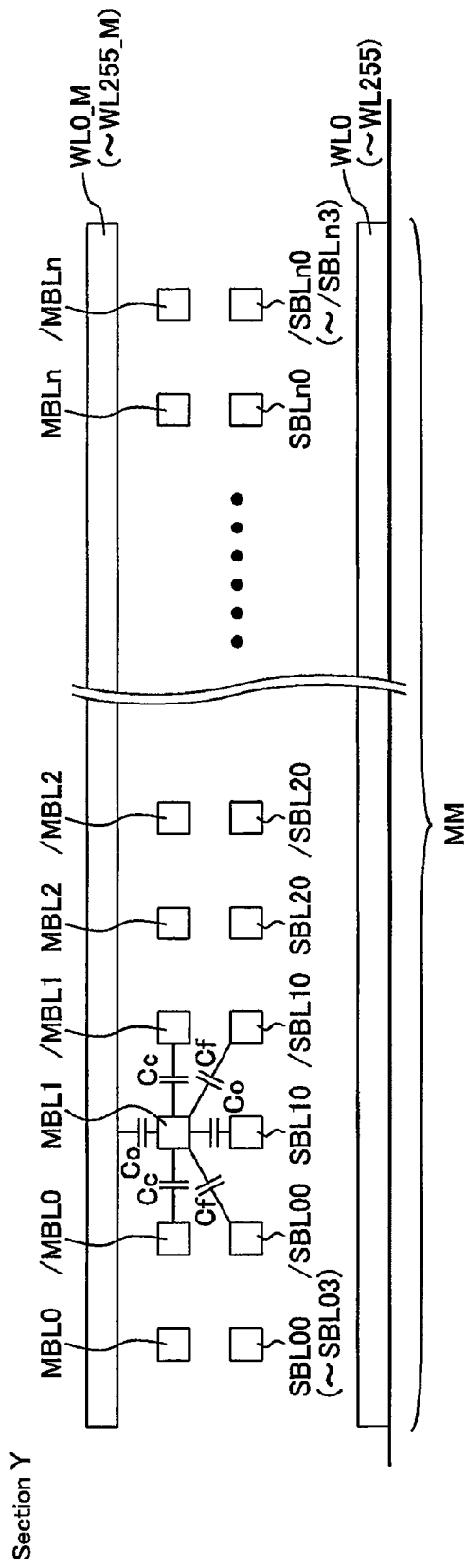
FIG. 14 is a view illustrating a section Y in FIG. 13.

FIG. 12 is a vertical cross-sectional view taken at the main bit line MBL0. Either a memory cell gate TG and a bit-line connecting gate SW or two memory cell gates TG (nMOS-FETs) are formed for every set of n-type doped regions OD. A portion near the center of the set of n-type doped regions OD serves as a source/drain region shared by two gates, whereas portions near both ends thereof serve as source/drain regions specific to respective gates. Each of the source/drain regions is connected to a storage electrode SN of a memory cell capacitor Cs via a storage contact CA, is connected to the sub bit line SBL via a storage contact CA and a sub-bit-line contact CH, or is connected to the main bit line MBL via a storage contact CA, a sub-bit-line contact CH and a via V1 of a metal interconnection.

The bit-line connecting gates SW and the memory cell gates TG have the same gate width. The bit-line connecting gates SW have a gate length smaller than that of the memory cell gates TG. The current driving ability of the bit-line connecting gates SW is higher than that of the memory cell gates TG, whereas channel leakage of the memory cell gates TG is smaller than that of the bit-line connecting gates SW. Specifically, the gate length of the memory cell gates TG is preferably as large as possible as long as the cell area is not increased. The difference in gate length between the memory cell gates TG and the bit-line connecting gates SW is preferably set in the range at which uniformity in fabrication processes is not interrupted in terms of miniaturization.

The settings described above reduce a speed penalty (i.e., decrease in access time) caused by serial connection of a memory cell gate TG and a bit-line connecting gate SW on a path through which data is read out from a memory cell to a sense amplifier in a DRAM with a hierarchical bit-line architecture, for example. It should be noted that requirement for suppressing channel leakage of the bit-line connecting gates SW is less strict than that of the memory cell gates TG. On the other hand, for the memory cell gates TG, channel leakage is suppressed so that retention time of charge stored in the cell capacitor Cs is kept long.

As in the DRAMs described in the foregoing embodiments, side coupling capacitance is especially dominant in a semiconductor memory device with a small memory cell area and a fine line pitch. Accordingly, the effect of reducing parasitic capacitance as described above is easily obtained. However, the present invention is not limited to this, and the same advantages are obtained for nonvolatile memory devices such as static RAMs and flash memories.

The hierarchical bit-line architecture has a relatively small number of connection points between main bit lines and sub bit lines so that the main bit lines are relatively easily divided among a plurality of interconnection layers and parasitic capacitance is easily reduced. However, even in a memory having no hierarchical bit-line architecture, the present invention provides the same mechanism of easily reducing side coupling capacitance by dividing bit lines among a plurality of interconnection layers. This mechanism is also applicable to memory devices such as SRAMs, NAND flash memories, MRAMs, PRAMs, and ReRAMs.

The present invention is not limited to semiconductor memory devices with the folded bit-line architecture as described above. Even in a semiconductor memory device with an open bit-line architecture in which a pair of main bit lines extends in different memory arrays for sense amplifiers, the main bit lines may be alternately arranged such that adjacent main bit lines are located in two different interconnection layers in each main memory array.

The main bit lines are not necessarily provided in two interconnection layers and may be provided in three or more interconnection layers so that the distance between main bit lines is increased.

The configurations described in the embodiments and the modified examples thereof may be variously combined as long as these combinations are logically practicable. Specifically, the settings of the gate length described in the fifth embodiment may be applied to the semiconductor memory devices with the hierarchical architectures described in the first through fourth embodiments, for example.

As described above, according to the embodiments of the present invention, even with a finer line pitch, for example, advantages such as easy suppression of decrease in a read-out voltage are obtained. Thus, the present invention is useful for semiconductor memory devices such as dynamic random access memories (DRAMs), static RAMs (SRAMs), flash memories, MRAMs, PRAMs, and ReRAMs, and other devices.

What is claimed is:

1. A semiconductor memory device, comprising:
   a memory array in which a plurality of memory cells are arranged in rows and columns; and
   a plurality of bit lines associated with the respective columns of the memory cells,
   wherein the bit lines include main bit lines and sub bit lines to have a hierarchical structure,
   the main bit lines are divided among a plurality of interconnection layers, and
   a distance between the main bit lines in one of the interconnection layers is twice as large as the distance between the sub bit lines.

2. The semiconductor memory device of claim 1, wherein a given-potential line having a given potential is provided between each adjacent ones of the main bit lines in one of the interconnection layers.

3. The semiconductor memory device of claim 2, wherein a distance between the given-potential line and an adjacent one of the main bit lines in one of the interconnection layers is equal to the distance between the sub bit lines.

4. The semiconductor memory device of claim 2, wherein the given-potential line is kept at a given fixed potential.

5. The semiconductor memory device of claim 4, wherein the given fixed potential is a potential of a power supply line for supplying a voltage to a sense amplifier for amplifying a signal read out from one of the memory cells to an associated one of the main bit lines, and
   the power supply line form a mesh interconnection structure.

6. The semiconductor memory device of claim 2, wherein the given-potential line is a data line which is shared by at least two sense amplifiers for amplifying signals read out from the memory cells to the main bit lines and is used for transmitting data output from the sense amplifiers.

7. The semiconductor memory device of claim 6, wherein the data line is wider than the main bit lines.

8. The semiconductor memory device of claim 1, wherein an interconnection layer including word-line backing lines which back word lines made of a semiconductor is interposed between the interconnection layers including the main bit lines.

9. A semiconductor memory device, comprising:
   a memory array in which a plurality of memory cells are arranged in rows and columns; and
   a plurality of bit lines associated with the respective columns of the memory cells,
   wherein the bit lines include main bit lines and sub bit lines to have a hierarchical structure,
   the main bit lines are divided among a plurality of interconnection layers,
   a distance between the main bit lines in one of the interconnection layers is larger than a distance between the sub bit lines, and
   each two of the main bit lines which are adjacent to each other when viewed from above a substrate including the memory cells are included in different ones of the interconnection layers.

10. The semiconductor memory device of claim 9, wherein a given-potential line having a given potential is provided between each adjacent ones of the main bit lines in one of the interconnection layers.

11. The semiconductor memory device of claim 10, wherein a distance between the given-potential line and an adjacent one of the main bit lines in one of the interconnection layers is equal to the distance between the sub bit lines.

12. The semiconductor memory device of claim 10, wherein the given-potential line is kept at a given fixed potential.

13. The semiconductor memory device of claim 12, wherein the given fixed potential is a potential of a power supply line for supplying a voltage to a sense amplifier for amplifying a signal read out from one of the memory cells to an associated one of the main bit lines, and
   the power supply line form a mesh interconnection structure.

14. The semiconductor memory device of claim 10, wherein the given-potential line is a data line which is shared by at least two sense amplifiers for amplifying signals read out from the memory cells to the main bit lines and is used for transmitting data output from the sense amplifiers.

15. The semiconductor memory device of claim 14, wherein the data line is wider than the main bit lines.

16. The semiconductor memory device of claim 9, wherein an interconnection layer including word-line backing lines which back word lines made of a semiconductor is interposed between the interconnection layers including the main bit lines.

17. A semiconductor memory device, comprising:
   a memory array in which a plurality of memory cells are arranged in rows and columns; and
   a plurality of bit lines associated with the respective columns of the memory cells,
   wherein the bit lines include main bit lines and sub bit lines to have a hierarchical structure,
   the main bit lines are divided among a plurality of interconnection layers, a distance between the main bit lines in one of the interconnection layers is larger than a distance between the sub bit lines, each two of the main bit lines associated with two of the memory cells which are adjacent to each other in the row direction are included in different ones of the interconnection layers, and the main bit lines are evenly spaced in each of the interconnection layers.

18. The semiconductor memory devices of claim 17, wherein the main bit lines in one of the interconnection layers shift ½ from the main bit lines in another of the interconnection layers when viewed from above a substrate including the memory cells.

19. The semiconductor memory device of claim 17, wherein a given-potential line having a given potential is provided between each adjacent ones of the main bit lines in one of the interconnection layers.

20. The semiconductor memory device of claim 17, wherein a given-potential line having a given potential is provided between each adjacent ones of the main bit lines in one of the interconnection layers.

21. The semiconductor memory device of claim 20, wherein a distance between the given-potential line and an adjacent one of the main bit lines in one of the interconnection layers is equal to the distance between the sub bit lines.

22. The semiconductor memory device of claim 20, wherein the given-potential line is kept at a given fixed potential.

23. The semiconductor memory device of claim 22, wherein the given fixed potential is a potential of a power supply line for supplying a voltage to a sense amplifier for amplifying a signal read out from one of the memory cells to an associated one of the main bit lines, and the power supply line form a mesh interconnection structure.

24. The semiconductor memory device of claim 20, wherein the given-potential line is a data line which is shared by at least two sense amplifiers for amplifying signals read out from the memory cells to the main bit lines and is used for transmitting data output from the sense amplifiers.

25. The semiconductor memory device of claim 24, wherein the data line is wider than the main bit lines.

26. The semiconductor memory device of claim 17, wherein an interconnection layer including word-line backing lines which back word lines made of a semiconductor is interposed between the interconnection layers including the main bit lines.

27. A semiconductor memory device, comprising:
a memory array in which a plurality of memory cells are arranged in rows and columns; and
a plurality of bit lines associated with the respective columns of the memory cells,
wherein the bit lines include main bit lines and sub bit lines to have a hierarchical structure,
the main bit lines are divided among a plurality of interconnection layers,
a distance between the main bit lines in one of the interconnection layers is larger than a distance between the sub bit lines,
each two of the main bit lines form a pair of complementary bit lines in a folded bit-line architecture, and
the main bit lines are divided among the interconnection layers in units of pairs of complementary bit lines.

28. The semiconductor memory device of claim 27, wherein the pairs of complementary bit lines are evenly spaced in each of the interconnection layers.

29. The semiconductor memory device of claim 27, wherein a given-potential line having a given potential is provided between each adjacent ones of the main bit lines in one of the interconnection layers.

30. The semiconductor memory device of claim 29, wherein a distance between the given-potential line and an adjacent one of the main bit lines in one of the interconnection layers is equal to the distance between the sub bit lines.

31. The semiconductor memory device of claim 29, wherein the given-potential line is kept at a given fixed potential.

32. The semiconductor memory device of claim 31, wherein the given fixed potential is a potential of a power supply line for supplying a voltage to a sense amplifier for amplifying a signal read out from one of the memory cells to an associated one of the main bit lines, and the power supply line form a mesh interconnection structure.

33. The semiconductor memory device of claim 29, wherein the given-potential line is a data line which is shared by at least two sense amplifiers for amplifying signals read out from the memory cells to the main bit lines and is used for transmitting data output from the sense amplifiers.

34. The semiconductor memory device of claim 33, wherein the data line is wider than the main bit lines.

35. The semiconductor memory device of claim 27, wherein an interconnection layer including word-line backing lines which back word lines made of a semiconductor is interposed between the interconnection layers including the main bit lines.

36. A semiconductor memory device, comprising:
a memory array in which a plurality of memory cells are arranged in rows and columns; and
a plurality of bit lines associated with the respective columns of the memory cells,
wherein the bit lines include main bit lines and sub bit lines to have a hierarchical structure,
the main bit lines are divided among a plurality of interconnection layers,
a distance between the main bit lines in one of the interconnection layers is larger than a distance between the sub bit lines,
each two of the main bit lines form a pair of complementary bit lines in a folded bit-line architecture,
the main bit lines form pairs of complementary bit lines, and
adjacent ones of the pairs of complementary bit lines when viewed from above a substrate including the memory cells are respectively provided in different ones of the interconnection layers.

37. The semiconductor memory device of claim 36, wherein a given-potential line having a given potential is provided between each adjacent ones of the main bit lines in one of the interconnection layers.

38. The semiconductor memory device of claim 37, wherein a distance between the given-potential line and an adjacent one of the main bit lines in one of the interconnection layers is equal to the distance between the sub bit lines.

39. The semiconductor memory device of claim 37, wherein the given-potential line is kept at a given fixed potential.

40. The semiconductor memory device of claim 39, wherein the given fixed potential is a potential of a power supply line for supplying a voltage to a sense amplifier for amplifying a signal read out from one of the memory cells to an associated one of the main bit lines, and the power supply line form a mesh interconnection structure.

41. The semiconductor memory device of claim 37, wherein the given-potential line is a data line which is shared by at least two sense amplifiers for amplifying signals read out from the memory cells to the main bit lines and is used for transmitting data output from the sense amplifiers.

42. The semiconductor memory device of claim 41, wherein the data line is wider than the main bit lines.

43. The semiconductor memory device of claim 36, wherein an interconnection layer including word-line backing lines which back word lines made of a semiconductor is interposed between the interconnection layers including the main bit lines.

* * * * *